US008217700B1

(12) United States Patent
Williams et al.

(10) Patent No.: US 8,217,700 B1
(45) Date of Patent: Jul. 10, 2012

(54) MULTIFUNCTION INPUT/OUTPUT CIRCUIT

(75) Inventors: Timothy Williams, San Jose, CA (US); Harold Kutz, San Jose, CA (US); Warren Snyder, San Jose, CA (US); David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 52 days.

(21) Appl. No.: 12/496,590

(22) Filed: Jul. 1, 2009

Related U.S. Application Data

(60) Provisional application No. 61/077,469, filed on Jul. 1, 2008.

(51) Int. Cl.
*H03L 5/00* (2006.01)

(52) U.S. Cl. .......... 327/333; 327/564; 327/565; 326/41; 326/47

(58) Field of Classification Search .................. 327/333, 327/564–565; 326/41, 47
See application file for complete search history.

(56) References Cited

U.S. PATENT DOCUMENTS

| | | | | |
|---|---|---|---|---|
| 5,107,146 A * | 4/1992 | El-Ayat | ............................ | 326/41 |
| 5,317,210 A * | 5/1994 | Patel | ................................ | 326/40 |
| 5,371,422 A * | 12/1994 | Patel et al. | ........................ | 326/41 |
| 5,412,261 A * | 5/1995 | Whitten | ............................ | 264/41 |
| 5,424,589 A * | 6/1995 | Dobbelaere et al. | ............ | 326/41 |
| 5,625,301 A * | 4/1997 | Plants et al. | ..................... | 326/41 |
| 5,671,432 A * | 9/1997 | Bertolet et al. | ................... | 712/11 |
| 5,894,565 A * | 4/1999 | Furtek et al. | ..................... | 326/38 |
| 6,054,881 A * | 4/2000 | Stoenner | ........................ | 327/112 |
| 6,097,988 A * | 8/2000 | Tobias | ............................ | 700/23 |
| 6,246,259 B1 * | 6/2001 | Zaliznyak et al. | ............... | 326/41 |
| 6,300,800 B1 * | 10/2001 | Schmitt et al. | .................... | 326/86 |
| 6,417,692 B2 * | 7/2002 | Shiflet | ............................. | 326/41 |
| 6,426,649 B1 * | 7/2002 | Fu et al. | ........................... | 326/41 |
| 6,825,689 B1 * | 11/2004 | Snyder | ............................. | 326/41 |
| 6,856,173 B1 * | 2/2005 | Chun | ............................ | 326/108 |
| 6,859,066 B1 * | 2/2005 | Rahman et al. | ................... | 326/63 |
| 6,870,397 B1 * | 3/2005 | Fox et al. | .......................... | 326/41 |
| 6,900,660 B2 * | 5/2005 | Piasecki et al. | ................... | 326/41 |
| 7,142,017 B2 * | 11/2006 | Chen | ............................... | 326/85 |

OTHER PUBLICATIONS

"PSoC® Mixed-Signal Array Technical Reference Manual", Cypress Semiconductor Corporation, Oct. 14, 2008.

* cited by examiner

*Primary Examiner* — Kenneth B. Wells

(57) ABSTRACT

In one example, a chip includes integrated components configured to operate in the digital domain and the analog domain. An I/O pad located on the chip is configured to provide an external device access to the integrated components. A multifunction I/O interface cell between the I/O pad and the integrated components is configured to selectively connect different combinations of the components to the same I/O pad at different times. The multifunction I/O interface cell may include a first switching device connected to ground, a second switching device connected to a reference voltage, an analog input/output buffer, and a digital input/output buffer.

23 Claims, 5 Drawing Sheets

MULTIFUNCTION INPUT/OUTPUT CIRCUIT

This application claims the benefit of U.S. Provisional Application No. 61/077,469, filed Jul. 1, 2008, which is incorporated by reference herein in its entirety.

TECHNICAL FIELD

This disclosure relates generally to circuitry, and more particularly to configurable input/output pins.

BACKGROUND

An input/output (I/O) pin of an integrated circuit is typically used to provide a single pre-assigned signal. When a circuit device is operable to communicate several signals, several I/O pins are attached to the circuit device.

SUMMARY

The following is a summary in order to provide a basic understanding of some aspects of the invention. This summary is not intended to identify key/critical elements of the invention or to delineate scope. Its sole purpose is to present some concepts of the invention in a simplified form as a prelude to the more detailed description that is presented later.

In one example, an I/O pad of a chip is selectively connected to a plurality of on-chip components, such as an on-chip analog component and an on-chip digital component, through a multifunction I/O interface cell. A controller controls the multifunction I/O interface cell to cause any combination of the on-chip components to be connected to the I/O pad at any given time, such as any one of the on-chip components, all of the on-chip components, or any subset of the on-chip components, which may serve to both reduce pin count and enable certain functionality for the chip.

DETAILED DESCRIPTION

Several examples of the present application will now be described with reference to the accompanying drawings. Various other examples of the invention are also possible and practical. This application may be exemplified in many different forms and should not be construed as being limited to the examples set forth herein.

Figure 1A:
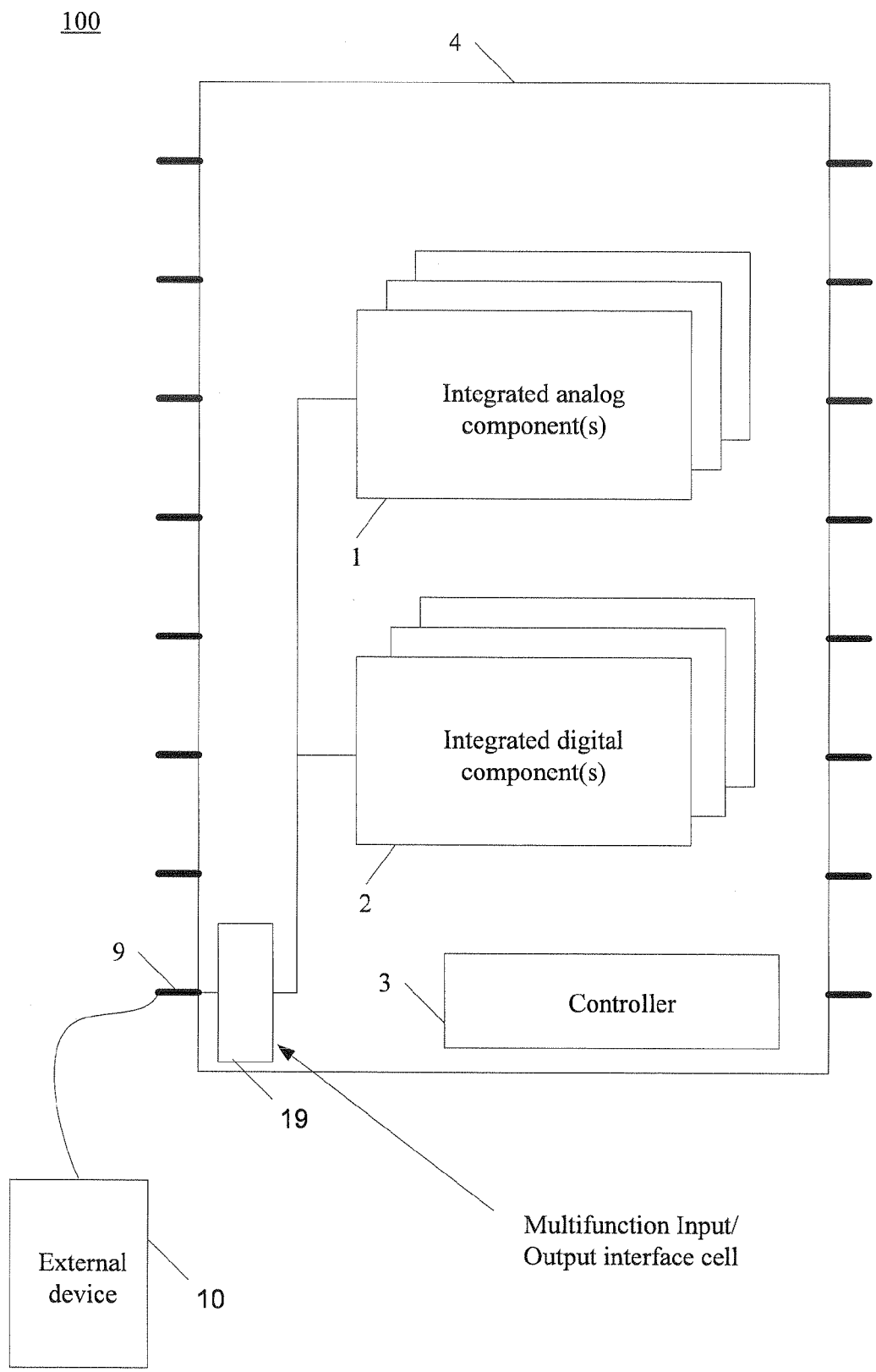
FIG. 1A shows a chip having a multifunction I/O interface cell in an embodiment.

FIG. 1A shows a chip having a multifunction I/O interface cell in an embodiment.

Before discussing the chip of FIG. 1, it is noted that I/O pins of a configurable device such as a configurable microcontroller may use several different types of signaling. These may include analog and digital signals, which may be inputs, outputs, or combination input/outputs. Furthermore, the types of analog or digital signals may vary. For example, the device may drive out signals interfacing with LCD panels, which use switching between a discrete set of analog voltages. Another I/O pin may interface with sensors using continuous, low-noise input or output signaling. Other I/O pins may interface with capacitive sensors for touch sensing, which use switching between ground or a fixed voltage, and then switching to an analog voltage, to charge and sample a capacitor. Still other I/O pins may carry logic signals, as inputs, outputs, or bidirectional input/outputs. In addition, the interface function of an I/O pin may change over time. Some devices may provide I/O pin interfaces with customized I/O cells with different functions available at different I/O pins.

The system 100 includes a chip 4 having a multifunction I/O interface cell 19, which selectively connects its corresponding I/O pad 9 with a plurality of integrated components, which in the present example includes both analog components 1 and digital components 2. A controller 3 controls the multifunction I/O interface cell 19 to determine which components(s) 1 and 2 are connected with the I/O pad 9 at any given time.

It should be understood that the multifunction I/O interface cell 19 may cause the I/O pad 9 to be used as either an output, and/or an input, according to the controller 3. In the present example, where the chip 4 operates in both the analog and digital domains, the multifunction I/O interface cell 19 may be used to cause the I/O pad 9 to send and/or receive digital signals, or analog signals, according to the controller 3.

Although the chip 4 shown in the example system 100 operates in both the analog and digital domains, it should be apparent that the multifunction I/O interface cell 19 may be used in other systems including all-digital and all-analog systems. Also, it should be apparent that, even in a mixed analog and digital system, the multifunction I/O interface cell 19 may be connected to only analog components or only digital components.

It should be understood that the controller 3 may be implemented in a variety of different ways. For example, the controller 3 may comprise logic enabling and disabling the internal components 1 and 2 to selectively connect/disconnect such components from the corresponding I/O pad 9. In other examples, the controller 3 may comprise a plurality of registers that are set or unset by a CPU to selectively connect/disconnect components from the corresponding pad 9.

For brevity, the illustration shows only one multifunction I/O cell 19 for the chip 4. It should be understood that other iterations include multifunction I/O cells 19 operating at the other I/O pads. There may be a multifunction I/O cell 19 operating at every I/O pad, or perhaps a designated subset of the I/O pads of the chip 4, in an embodiment.

Multifunction I/O cells may be controlled by individual controllers, or a common controller. Furthermore, such controller(s) may be partially or completely integrated into the multifunction I/O cell(s), or separate as shown.

Figure 1B:
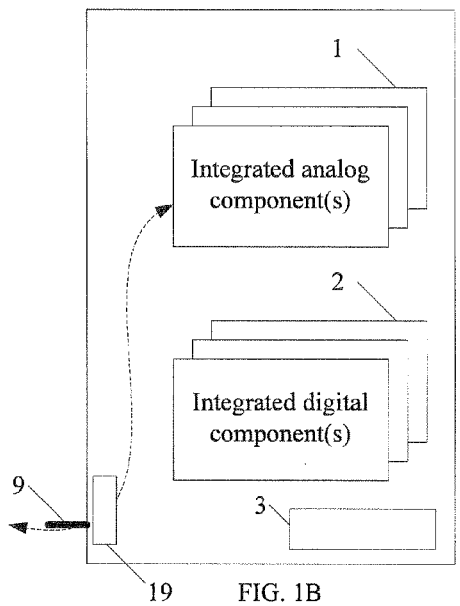
FIG. 1B illustrates the multifunction I/O interface cell of FIG. 1 selectively connecting a particular on-chip component to its corresponding I/O pad in an embodiment.

FIG. 1B illustrates the multifunction I/O interface cell of FIG. 1 selectively connecting a particular on-chip component to its corresponding I/O pad in an embodiment.

The dashed line of FIG. 1B shows an enabled connection between the I/O pad 9 and an analog component 1 through the multifunction I/O interface cell 19. Although it is not shown, it should be understood that at another time, the multifunction I/O interface cell 19 may cause the I/O pad 9 to be selectively disconnected from the analog component 1 and selectively connected to one of the digital components 2 according to settings of the controller 3. Thus, a single multifunction I/O interface cell 19 and corresponding I/O pad 9 may be used to provide an external device 10 (which is any type of circuitry to send and receive signals to and from the chip 4) access to a plurality of internal components such as a Digital to Analog Convertors (DACs), Analog to Digital Convertor (ADCs), comparators, internal amplifiers, filters, timers, Pulse Width Modulators (PWMs), Universal Asynchronous Receiver Transmitter (UARTs), Serial Port Interface (SPIs), etc.

Figure 1C:
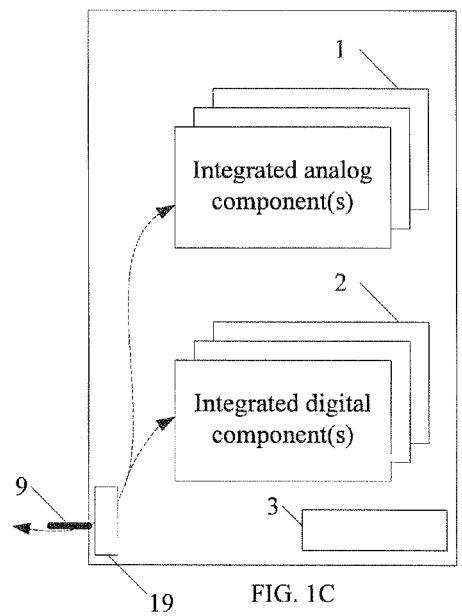
FIG. 1C illustrates the multifunction I/O interface cell of FIG. 1 simultaneously connecting more than one on-chip component to its corresponding I/O pad in an embodiment.

FIG. 1C illustrates the multifunction I/O interface cell of FIG. 1 simultaneously connecting more than one on-chip component to its corresponding I/O pad in an embodiment.

The dashed line of FIG. 1C shows that the multifunction I/O interface cell 19 may simultaneously enable connections between the I/O pad 9 and a plurality of on-chip components according to the controller 3. Such a plurality may include any combination of analog and digital components 1 and 2, such as one or more analog components and one or more digital components, two or more analog components, or two or more digital components.

For example, the controller 3 may be configured to cause the multifunction I/O interface cell 19 to selectively connect the corresponding I/O pad 9 to an op-amp linear driver to drive out a signal from the op-amp linear driver to an external device. At the same time, the multifunction I/O interface cell 19 may selectively connect the corresponding I/O pad 9 to another on-chip component that may receive the same signal received by the external device. This on-chip component may process the received signal in some way, for example, measure characteristics of the received signal. This may be used to verify that the signal the chip is actually outputting matches an intended output of the chip, e.g. that the output signal of the chip is operating with an expected range.

The concept described above may be particularly useful for bringing a signal from one domain into another domain. For example, an output analog signal from the analog domain of the chip may be brought back into the digital domain of the chip through the multifunction I/O interface cell 19, and vice versa.

It should be apparent that there is no limit to the number of internal components that may be selectively connected through the multifunction I/O interface cell 19. For example, the multifunction I/O interface cell 19 may be used to connect an output path to I/O pad 9, and simultaneously bring the signal of that output path back into any number of input paths (such as one analog input path and one digital input path).

Figure 1D:
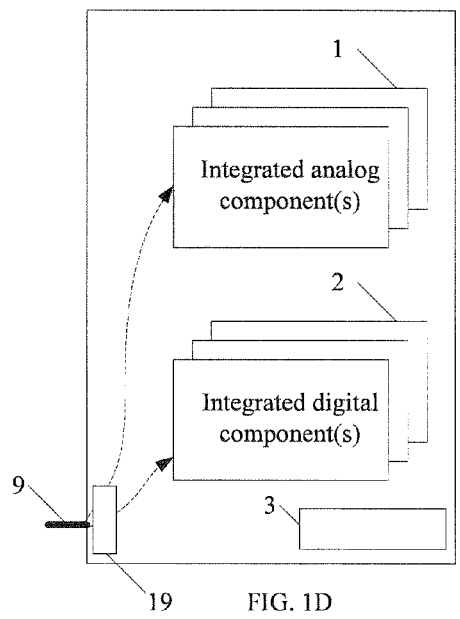
FIGS. 1D and 1E illustrate the multifunction I/O interface cell of FIG. 1 providing an internal connection between on-chip components in an embodiment.
Figure 1E:
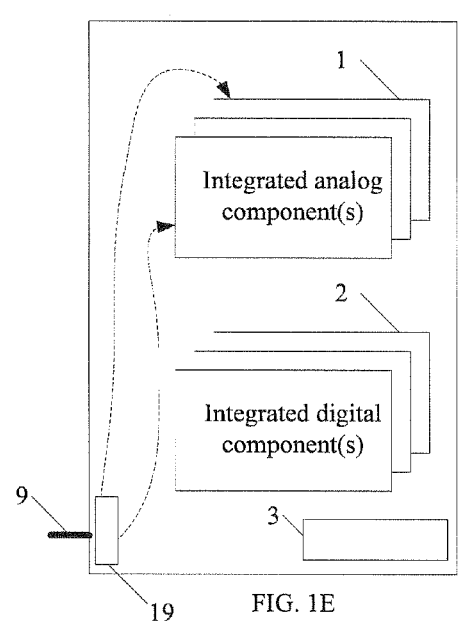

FIGS. 1D and 1E illustrate the multifunction I/O interface cell of FIG. 1 providing an internal connection between on-chip components in an embodiment.

The dashed lines of FIGS. 1D and 1E show that the controller 3 may even be configured to use the multifunction I/O interface cell 19 as a connection point back into the chip. For example, if the pad 9 is disconnected from an external device (either because no external device has been attached to the pad 9 or even because a controller has selectively disconnected the pad 9 from the external device), the multifunction I/O interface cell 19 may still be used by the chip to provide a connection between internal components. Thus, the multifunction I/O interface cell 19 may be extended to provide an internal connection between components that might not otherwise be available using internal pathways (for example because such internal pathways are currently being used by other components).

Figure 2A:
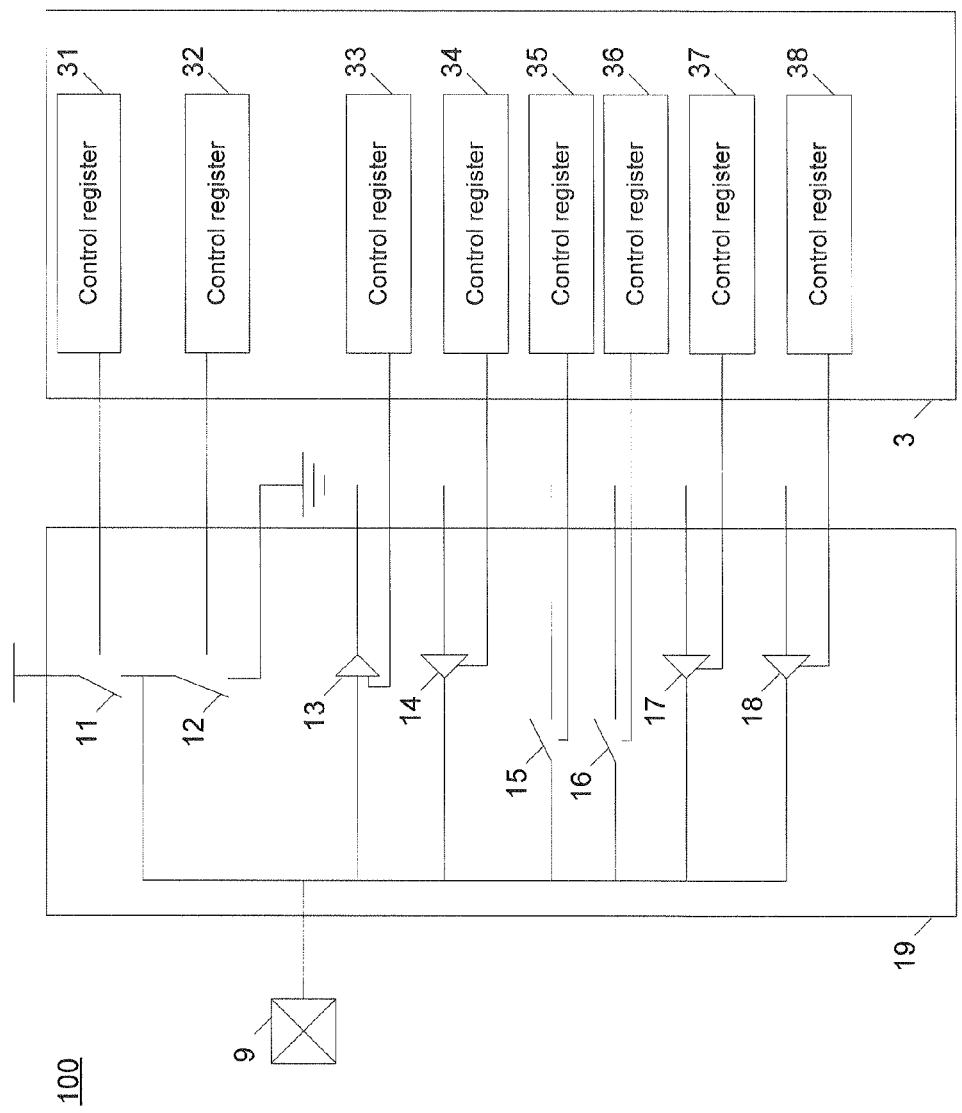
FIG. 2A shows a detailed example of the multifunction I/O interface cell of FIGS. 1A-E.

FIG. 2A shows a detailed example of the multifunction I/O interface cell of FIGS. 1A-E in an embodiment.

Before discussing the illustrated detailed example of the multifunction I/O interface cell 19, it is noted that the illustrated example shows one particular combination of functions that may be provided by the multifunction I/O interface cell 19. Other examples may include a different combination of functions, including additional functions besides those shown or only some of those functions shown.

In the present example, the multifunction I/O interface cell 19 may provide a reference voltage (either the supply voltage or another different voltage such as a user programmed voltage that may be set to a value other than the supply voltage) to the corresponding I/O pad 9 if the control register 31 enables the switch 11. The multifunction I/O interface cell 19 may provide a ground to the corresponding I/O if the control register 32 enables the switch 12. Note that this example utilizes control registers but in other examples logic may control enablement of these switches 11 and 12. Accordingly, the corresponding I/O pad 9 may be dynamically assigned as a voltage source or a ground.

In the present example, the I/O pad 9 may be connected to internal components through either an on-chip digital input buffer 13 or on-chip digital output buffer 14 of the multifunction I/O interface cell 19, depending on the configuration of registers 33 and 34. In the present example, the buffers 13 and 14 are tri-state buffers, but may be any type of buffer in other examples. It should be understood that these buffers are connected to on-chip digital components, such as but not limited to timers, Pulse Width Modulators (PWMs), a Universal Asynchronous Receiver Transmitter (UART), a Serial Port Interface (SPI).

In the present example, the corresponding I/O pad 9 may be connected, through multifunction I/O interface cell 19, to a first on-chip analog component via analog input buffer 15 according to the control register 35. The corresponding I/O pad 9 may be connected to the same or another on-chip analog component via analog output buffer 16 according to the control register 36. Buffers 15 and 16 may be, in one case, bidirectional transmission gates. The multifunction I/O interface cell 19 may contain one or both of analog buffers 15 and 16. It should be understood that these buffers are connected to on-chip analog components, such as but not limited to a Digital to Analog Convertor (DAC), an Analog to Digital Convertor (ADC), a comparator, an internal amplifier, or a filter.

Other functions such as an LCD output buffer 17 may be included in the multifunction I/O pad. When this LCD output buffer function is used, the corresponding I/O pad 9 drives out a signal that switches between a discrete set of analog voltages. Other functions such as an Op-amp linear drive 18 (which is configured to drive to a continuous voltage range) may be included in the multifunction I/O pad 19. Such additional functions are controlled according to the registers 37 and 38.

As discussed previously, multiple paths to or from the corresponding I/O pad 9 may be enabled simultaneously. For example, the Op-amp linear drive 18 may drive out an analog level between ground and the supply voltage. At the same time, an analog input path 15 may be enabled to measure the actual signal appearing at the I/O pad 9, using an internal analog-to-digital converter. This may be done to perform peak voltage detection of the pad signal. At the same time, another analog path may be enabled to an internal comparator, in order to detect the midpoint crossing of the signal.

At the same time, digital input path 14 may be enabled in an application, in order to obtain a digital logic representation of the pad voltage. Such digital logic representation may then be monitored for any reason, such as to trigger an interrupt on a CPU if a certain threshold is reached. For example, if the Op-amp 18 is driving a sine wave signal onto the pad, the digital input path may be used to create a digital clock version of this signal, perhaps to measure the frequency of the signal with internal logic and/or identify a peak value in the signal.

The controller 3 may comprise programmable logic configured to rapidly enable and disable one or more of the functions 11-18 according to a programmed pattern. This may be used to feed back a waveform to another one of the functions 11-18, which might remain enabled while the programmed pattern is operating to enable/disable other functions.

The rapid enabling/disabling of a component may even occur in combination with other functions 11-18 being rapidly enabled/disabled. Perhaps while one or more of the functions 11-18 is temporarily enabled, the other functions 11-18 are temporarily disabled, and vice versa. This may be used for similar reasons as described above, or possibly as a scheme to maximize sharing of the I/O pad.

It is noted that, in an actual implementation, the multifunction I/O interface cell 19 and its corresponding I/O pad 9 may be integrated together. These blocks are shown separately in the figure merely for ease of explanation.

Figure 2B:
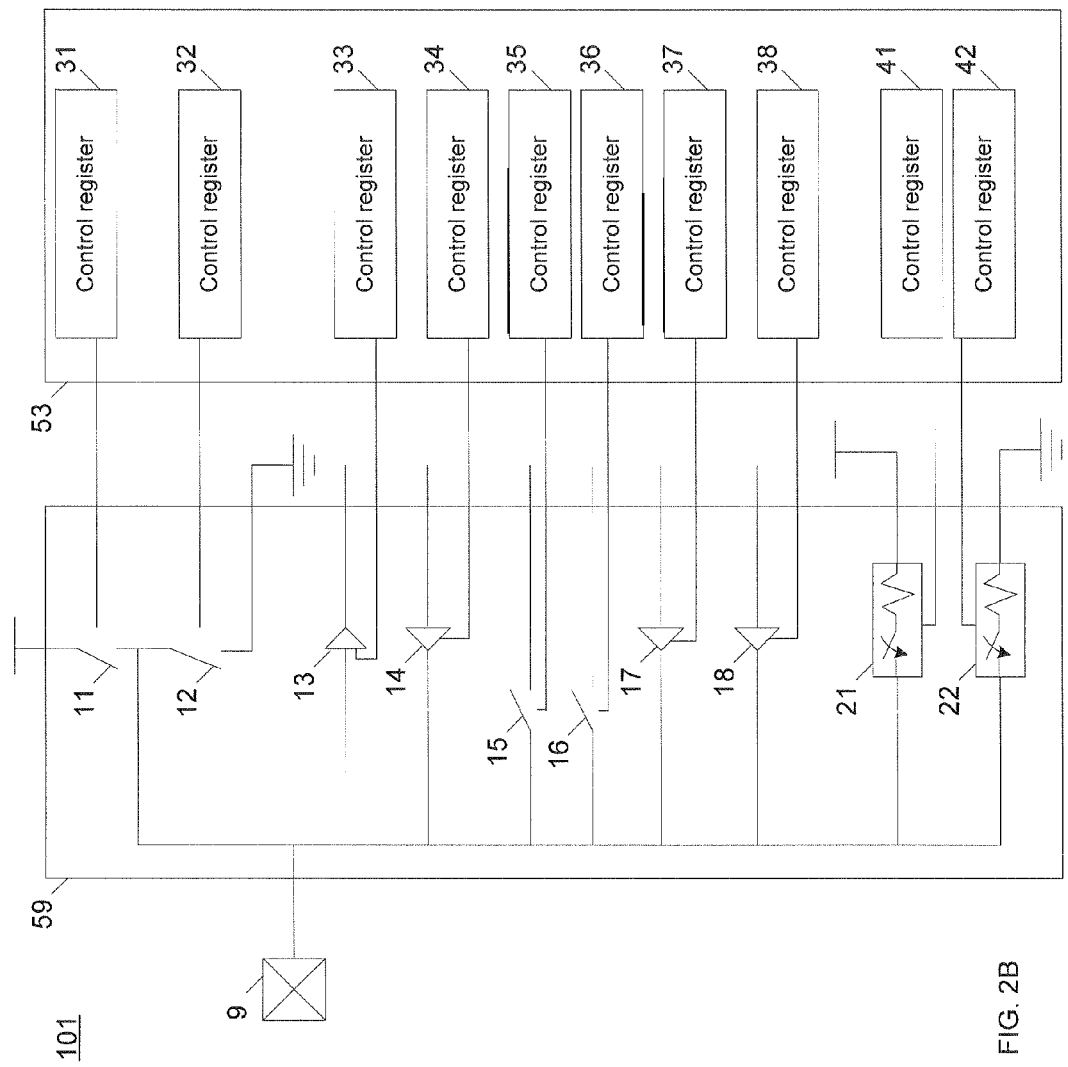
FIG. 2B shows a variant system similar to the system shown in FIG. 2A in an embodiment.

FIG. 2B shows a variant system similar to the system shown in FIG. 2A in an embodiment.

A variant system 101 similar to the system 100 includes an alternative example of a multifunction I/O interface chip 59 and controller 53. The additional components 21 and 22, when enabled according to the respective registers 41 and 42, are resistive connections, intended to provide a pull-up or pull-down function. This drive may be overdriven by an external or other internal driver.

Figure 3:
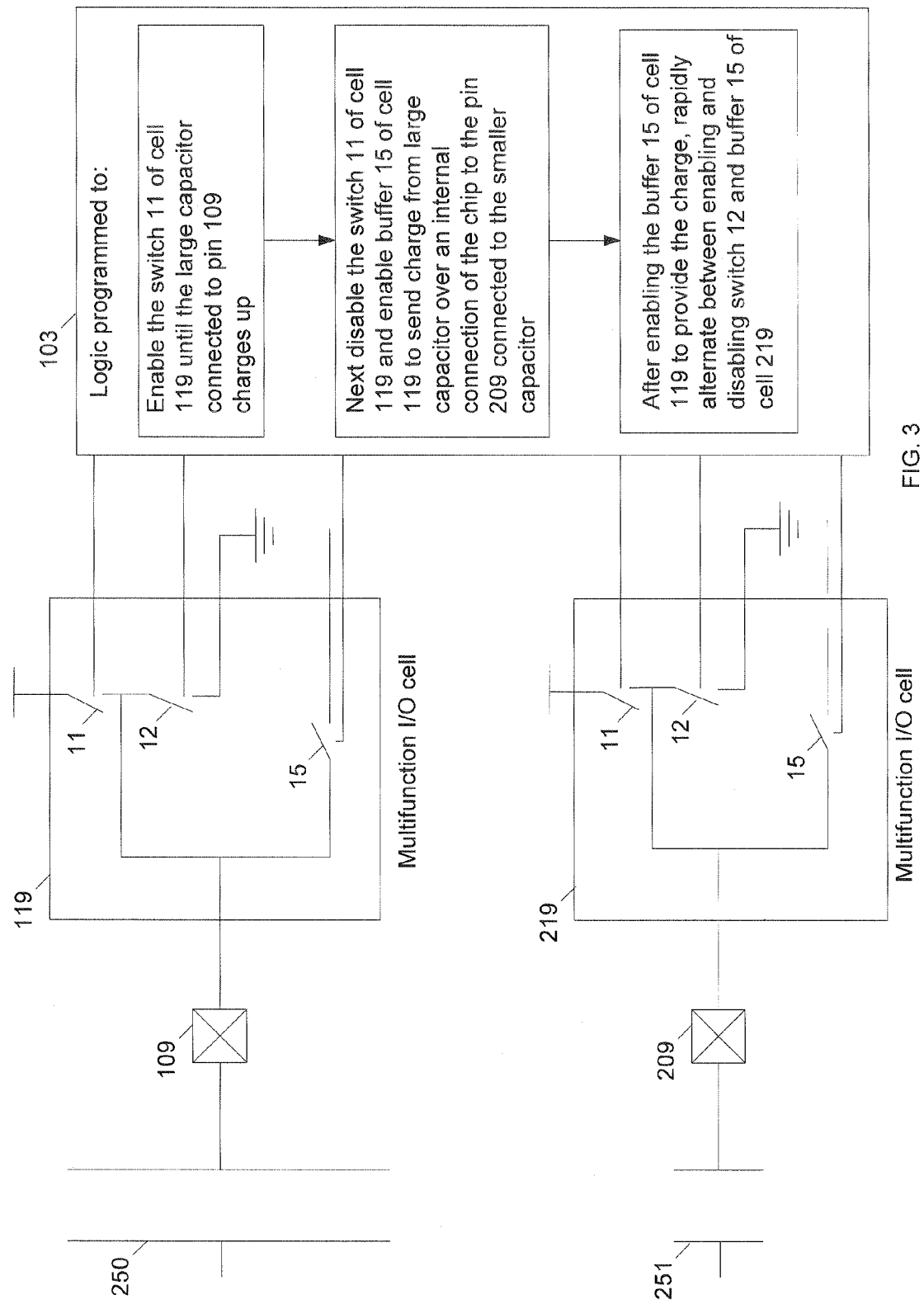
FIG. 3 illustrates a system having logic configured to enable/disable particular functions of two multifunction I/O interface cells of a chip according to a programmed sequence in an embodiment.

FIG. 3 illustrates a system having logic configured to enable/disable particular functions of two multifunction I/O interface cells of a chip according to a programmed sequence in an embodiment.

The multifunction I/O interface cell discussed herein may be utilized for a wide variety of applications. One such application is capacitive touch sensing.

In a capacitive touch sensing application, a smaller capacitor 251 is formed according to contact with a sensor. A larger capacitor 250 is used to measure the smaller capacitor 251 (by determining how long it takes to either charge or discharge the larger capacitor 250 using the smaller capacitor 251). This smaller capacitor is connected to a pad 209 of a chip having the multifunction I/O interface cells 119 and 219. The larger capacitor 250 is connected to a different pin 109 of the same chip.

The logic 103 is programmed to enable/disable particular functions of the two multifunction I/O interface cells 119 and 219 of the chip according to a programmed sequence. The programmed sequence begins by charging the larger capacitor 250 via enabling the switch 11 of cell 119 until the large capacitor charges up to the reference voltage. Next, the logic 103 disables the switch 11 of cell 119 and enables the buffer 15 of cell 119 to send stored charge from the large capacitor 250, over an internal connection of the chip, to the cell 219.

The logic 103 then rapidly alternates between enabling and disabling the switch 12 and the buffer 15 of cell 219. For example, for a first time period, the switch 12 is enabled and the buffer 15 is disabled (along with other functions of the cell 219). For a second time period, the buffer 15 is enabled and the switch 12 is disabled (along with other functions of the cell 219). Accordingly, the logic 103 and the cells 119 and 219 together discharge the larger capacitor 250 using the smaller capacitor 251. A variation of the logic 103 may be used to charge (rather than discharge) the larger capacitor 250 using the smaller capacitor 251.

It should be appreciated that capacitive touch sensing is just one of many applications that may utilize the multifunction I/O interface cell described herein. There are numerous applications that may utilize the multifunction I/O interface cell as high configurability is a feature of such cell. Depending on the particular application, it may be desirable to program logic to enable/disable functions of multifunction I/O interface cell(s) according to any sequence (which may be as simple as a first stage enabling one function of a cell and a second stage disabling that function). Also, as stated previously, any form of circuitry may be used to control the functions of the multifunction I/O interface cell, such as registers or logic.

The principles described herein may be combined with the principles described in co-pending patent application Ser. No. 12/496,579, which is incorporated by reference herein in its entirety for all purposes. It should be appreciated that combining these principles provides a highly configurable chip.

Examples have been described above with reference to the accompanying drawings. Various other examples of the invention are also possible and practical. The system may be exemplified in many different forms and should not be construed as being limited to the examples set forth above.

The figures listed above illustrate examples of the application and the operation of such examples. In the figures, the size of the boxes is not intended to represent the size of the various physical components. Where the same element appears in multiple figures, the same reference numeral is used to denote the element in all of the figures where it appears.

The system described above may use dedicated processor systems, micro controllers, programmable logic devices, or microprocessors that perform some or all of the operations described herein. Some of the operations described above may be implemented in software and other operations may be implemented in hardware.

The invention claimed is:

1. An apparatus, comprising:
an integrated circuit having a plurality of components integrated therein, wherein a portion of the plurality of components operate in a digital domain and another portion of the plurality of components operate in an analog domain;
an I/O pad located on the integrated circuit and configured to provide an external device access to the plurality of components; and
a programmable multifunction I/O interface cell comprising:
a first analog programmable connection to selectively couple the I/O pad to a first analog component of the plurality of components that operate in the analog domain, wherein the first analog component is configured to generate an output signal and output the output signal on the I/O pad; and
a second analog programmable connection to selectively couple the same I/O pad to a second analog component of the plurality of components that operate in the analog domain, wherein the first and second analog programmable connections are selectively connected to the same I/O pad at a first time during operation of the integrated circuit, and wherein the second analog component is configured to receive the output signal from the I/O pad.

2. The apparatus of claim 1, wherein the programmable multifunction I/O interface cell comprises a plurality of programmable connections configured to selectively connect the same I/O pad to two or more of the plurality of components simultaneously at a second time during operation of the integrated circuit and to selectively connect the same I/O pad to a different combination of two or more of the plurality of components simultaneously at a third time during the operation of the integrated circuit, wherein the plurality of programmable connections comprises at least the first analog programmable connection and the second analog programmable connection.

3. The apparatus of claim 2, wherein, at one of the second and third times, the programmable multifunction I/O interface cell is programmed to selectively connect the same I/O pad to a combination of the portion of the plurality of components that operate in the analog domain and the portion of the plurality of components that operate in the digital domain with any remaining components of the plurality being disconnected.

4. The apparatus of claim 2, wherein the multifunction I/O interface cell comprises a first switching device connected to ground, a second switching device connected to a reference voltage, an analog input/output buffer, a resistor configured as a pull-up or pull-down resistor, and a digital input/output buffer, and wherein the apparatus further comprises a plurality of registers configured to selectively enable and disable the switching devices and the input/output buffers.

5. The apparatus of claim 2, wherein the multifunction I/O interface cell comprises a first switching device connected to ground, a second switching device connected to a reference voltage, an analog input/output buffer, a resistor configured as a pull-up or pull-down resistor, and a digital input/output buffer, and wherein the apparatus further comprises programmable logic configured to selectively enable and disable the switching devices and the input/output buffers according to a programmed sequence.

6. The apparatus of claim 5, wherein the programmable logic is configured to enable and disable one of the switching devices or buffers of the programmable multifunction I/O interface cell to send a varying signal from a first component of the plurality of components to a second component of the plurality of components through the I/O pad.

7. The apparatus of claim 2, wherein the programmable multifunction I/O interface cell further comprises a first driver configured to drive to a set of discrete voltage levels and a second driver configured to drive to a continuous voltage range.

8. The apparatus of claim 2, wherein the plurality of components comprise analog components comprising at least one of a Digital to Analog convertor (DAC), an Analog to Digital Convertor (ADC), a comparator, an internal amplifier, or a filter, and digital components comprising at least one of a timer, a Pulse Width Modulator (PWM), a Universal Asynchronous Receiver Transmitter (UART), or a Serial Port Interface (SPI).

9. The apparatus of claim 1, wherein the multifunction I/O interface cell is set to drive out a signal generated by the first analog component through the I/O pad and at the same time feed such signal back into the second analog component.

10. The apparatus of claim 9, wherein the second analog component is configured to measure the fed back signal for determining, according to a measurement, whether the output signal generated by the first analog component is within an expected range.

11. The apparatus of claim 1, wherein the first analog programmable connection comprises a first analog input/output buffer coupled to the first analog component at the first time, and the second programmable connection comprises a second analog input/output buffer coupled to the second analog component at the first time.

12. An apparatus, comprising:
an integrated circuit having a plurality of components integrated therein, wherein the plurality of components comprises:
a first analog component;
a second analog component; and
one or more additional digital or analog components;
an I/O pad located on the integrated circuit and configured to provide an external device access to the plurality of components; and
a programmable multifunction I/O interface cell programmable to selectively connect a first analog input/output buffer to the I/O pad and the first analog component and to selectively connect a second analog input/output buffer to the same I/O pad and the second analog component simultaneously at a first time during operation of the integrated circuit, wherein the first analog component is configured to generate an output signal and output the output signal on the I/O pad, and wherein the second analog component is configured to receive the output signal from the I/O pad.

13. The apparatus of claim 12, wherein at a second time during operation of the integrated circuit, the programmable multifunction I/O interface cell is programmed to selectively connect the same I/O pad to a plurality of programmable connections to couple the same I/O pad to a different combination of the two of the plurality of components that operate in an analog domain or that operate in a digital domain with any remaining components of the plurality being disconnected from the same I/O pad.

14. The apparatus of claim 13, further comprising a plurality of registers configured to selectively enable and disable the programmable connections, wherein each of the programmable connections comprise a switching device or a buffer.

15. The apparatus of claim 13, further comprising programmable logic configured to selectively enable and disable the programmable connections according to a programmed sequence, wherein each of the programmable connections comprise a switching device or a buffer.

16. The apparatus of claim 15, wherein the programmable logic is configured to enable and disable one of the switching devices or buffers of the programmable multifunction I/O interface cell to send a varying signal from a third component of the plurality of components to a fourth component of the plurality of components through the I/O pad.

17. The apparatus of claim 13, wherein the programmable multifunction I/O interface cell further comprises a Liquid Crystal Display (LCD) output drive and an OpAmp linear drive.

18. The apparatus of claim 13, wherein the plurality of components comprise analog components comprising at least one of a Digital to Analog convertor (DAC), an Analog to Digital Convertor (ADC), a comparator, an internal amplifier, or a filter, and digital components comprising at least one of a timer, a Pulse Width Modulator (PWM), a Universal Asynchronous Receiver Transmitter (UART), or a Serial Port Interface (SPI).

19. The apparatus of claim 12, wherein the multifunction I/O interface cell is set to drive output a signal generated by the first analog component through the I/O pad and at the same time feed such signal back into the second analog component.

20. The apparatus of claim 19, wherein the second analog component is configured to measure the fed back signal for determining, according to a measurement, whether the output signal generated by the first analog component is within an expected range.

21. An apparatus, comprising:
an integrated circuit having a plurality of components integrated therein, wherein a portion of the plurality of components operate in a digital domain and another portion of the plurality of components operate in an analog domain;
an I/O pad located on the integrated circuit, wherein the I/O pad is disconnected from an external device; and
a programmable multifunction I/O interface cell configured to be programmed to selectively connect the same I/O pad to different combinations of two or more of the plurality of components simultaneously at different times during operation of the integrated circuit, wherein one of the different combinations comprises first and second components of the plurality of components, and wherein the programmable multifunction I/O interface cell is configured to route a signal between an output of the first component and an input of the second component via the same I/O pad without sending the signal out to the external device on the same I/O pad.

22. The apparatus of claim 21, wherein the first component operates in the analog domain and the second component operates in the analog domain.

23. The apparatus of claim 21, wherein the first component operates in the analog domain and the second component operates in the digital domain.

* * * * *